United States Patent [19]

Mathews

[11] Patent Number: 5,362,632
[45] Date of Patent: Nov. 8, 1994

[54] BARRIER PROCESS FOR TA$_2$O$_5$ CAPACITOR

[75] Inventor: Viju K. Mathews, Boise, Id.

[73] Assignee: Micron Semiconductor, Inc., Boise, Id.

[21] Appl. No.: 193,678

[22] Filed: Feb. 8, 1994

[51] Int. Cl.$^5$ .................................. H01L 21/70
[52] U.S. Cl. ............................. 437/47; 437/52; 437/60; 437/238; 437/919
[58] Field of Search ................ 437/47, 48, 52, 60, 437/233, 235, 238, 919; 257/310

[56] References Cited

U.S. PATENT DOCUMENTS

| | | |
|---|---|---|
| 4,891,684 | 1/1990 | Nishiolc et al. .............. 437/919 |
| 5,142,438 | 8/1992 | Reinberg et al. .............. 437/52 |
| 5,286,668 | 2/1994 | Chou .......................... 437/52 |

*Primary Examiner*—Tom Thomas
*Attorney, Agent, or Firm*—David J. Paul

[57] ABSTRACT

The method of the present invention introduces a fabrication method for forming a storage capacitor on a supporting silicon substrate of a semiconductor device, by the steps of: forming a bottom capacitor electrode comprising conductively doped polysilicon; forming an insulating layer over the bottom electrode via a first rapid thermal processing step (RTP) using rapid thermal silicon nitride (RTN); forming a capacitor dielectric material comprising tantalum oxide (Ta$_2$O$_5$) over the insulating layer; forming a semiconductive layer comprising polysilicon over the capacitor dielectric material; converting the semiconductive layer into a reaction prevention barrier by subjecting the semiconductive layer to a second rapid thermal processing step (RTP) using rapid thermal silicon nitride (RTN); and forming a top capacitor conductive electrode comprising titanium nitride (TiN) over the reaction prevention barrier.

16 Claims, 1 Drawing Sheet

BARRIER PROCESS FOR TA$_2$O$_5$ CAPACITOR

FIELD OF THE INVENTION

This invention relates generally to semiconductor fabrication and in particular to a fabrication method which provides a reaction prevention barrier between a conductive material and an insulative material.

BACKGROUND OF THE INVENTION

As semiconductor devices become more and more dense, it has become necessary to maximize the amount of die space used in order to successfully manufacture these devices while retaining relatively small package sizes. This is particularly true with dynamic random access memories (DRAMs) as memory density has increased while the space allowed for each storage capacitor has decreased.

FIG. 1, demonstrates a conventional approach taken to form a storage capacitor for DRAMs in less space. In this example, a bottom storage capacitor electrode 12 made from conductively doped polysilicon connects to diffusion layer 11. Electrode 12 was subjected to a rapid thermal processing step (in this case rapid thermal nitride (RTN)) which converts a top portion of polysilicon 12 into silicon nitride layer 13 (or RTN layer 13). Capacitor cell dielectric 14, tantalum oxide (Ta$_2$O$_5$), was formed over RTN layer 13. Finally, a titanium nitride (TiN) layer 15 was formed over cell dielectric layer 13 to form a top storage capacitor electrode.

A main problem with this approach is the fact that top electrode 15 will react chemically with cell dielectric 14 and thereby degrade the dielectric constant of the cell dielectric. This reaction will lead to a leaky capacitor as stored charge will propagate through leaky dielectric 15 and thus degrade the capacitor's ability to retain charge.

To solve the above problem, the present invention teaches a method to sufficiently eliminate the chemically degradation between a conductor and an insulator by forming a barrier therebetween.

SUMMARY OF THE INVENTION

The method of the present invention introduces a fabrication method for forming an reaction prevention barrier between a conductive material and an insulative material on a supporting substrate of a semiconductor device, by the steps of:
  forming the insulative material;
  forming a semiconductive layer over the insulative material;
  converting the semiconductive layer into a reaction prevention barrier via rapid thermally processed (RTP); and
  forming a conductive material over the reaction prevention barrier.

DETAILED DESCRIPTION OF THE INVENTION

A general concept of the present invention is depicted FIG. 2 which demonstrates process steps that may be integrated into any fabrication processes that could utilize the method described hereinafter. As one skilled in the art will recognize from the description that follows, the present invention may be integrated into any semiconductor fabrication process that would benefit from providing a reaction prevention layer between a conductor and an insulator.

Figure 1:
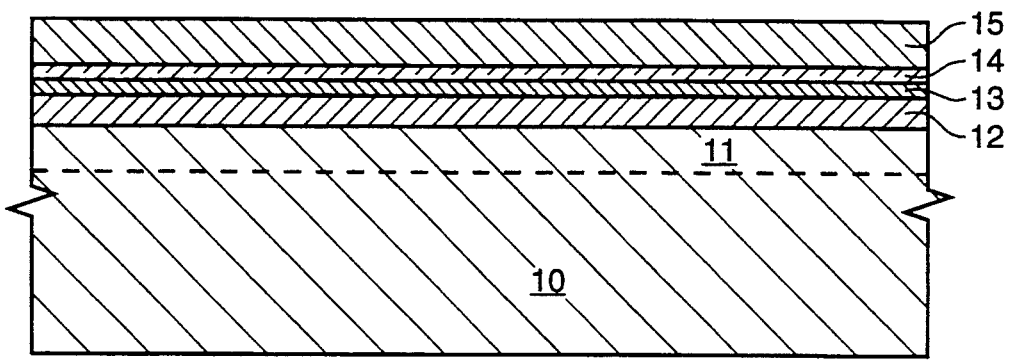
FIG. 1 is a composite cross-sectional view an in process wafer portion depicting a conventional method of forming a capacitor.
Figure 2:
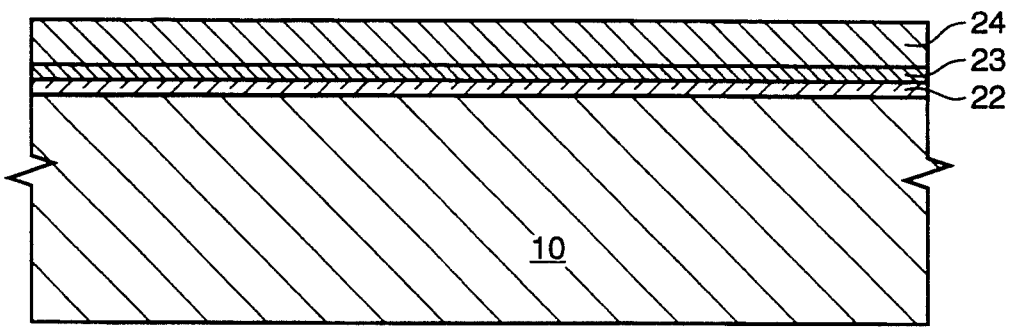
FIG. 2 is a composite cross-sectional view of an process wafer depicting a general concept of the present invention.

Referring now to FIG. 2, a supporting substrate 21 has been prepared by prior fabrication steps of a conventional or non-conventional process. For example, substrate 21 may be comprised of a silicon wafer or simply a material that has been previously processed over say a silicon (or germanium) substrate. Regardless of the nature of substrate 21, the general concept of the present invention will focus on the subsequent formation of layers 22, 23 and 24. The present invention is intended to create a reaction prevention barrier layer between a conductive material (layer 24) and insulative material (layer 22) that are chemically reactive with one another. Following the preparation of substrate 21, insulative material 22 is formed over substrate 21. Next, semiconductive layer 23 is formed over insulative material 22. Next, semiconductive layer 23 is converted into a reaction prevention barrier 23 by subjecting semiconductive layer 23 to a rapid thermal processing (RTP) step such as rapid thermal processed nitride (RTN) or rapid thermal processed oxide (RTO). Next, conductive material 24 is formed over reaction prevention barrier 23. (Conductive material 24 may comprise such conductive materials as various refractory metal nitrides, conductively doped polysilicon or metals.) Then the semiconductor device is completed with process selected.

A implementation of the present invention is depicted FIG. 3 which demonstrates process steps that may be integrated into any memory device fabrication processes that could utilize the method described hereinafter. The following discussion is that of integrating the present invention into a dynamic random access memory (DRAM) fabrication process.

Though, the process described hereinafter, refers to DRAM fabrication, it is meant to serve as an example for practicing the present invention. As one skilled in the art will recognize from the detailed description that follows, the present invention may be integrated into any semiconductor memory fabrication process that would benefit from the providing a reaction prevention layer between a conductively doped polysilicon and an underlying dielectric.

Figure 3:
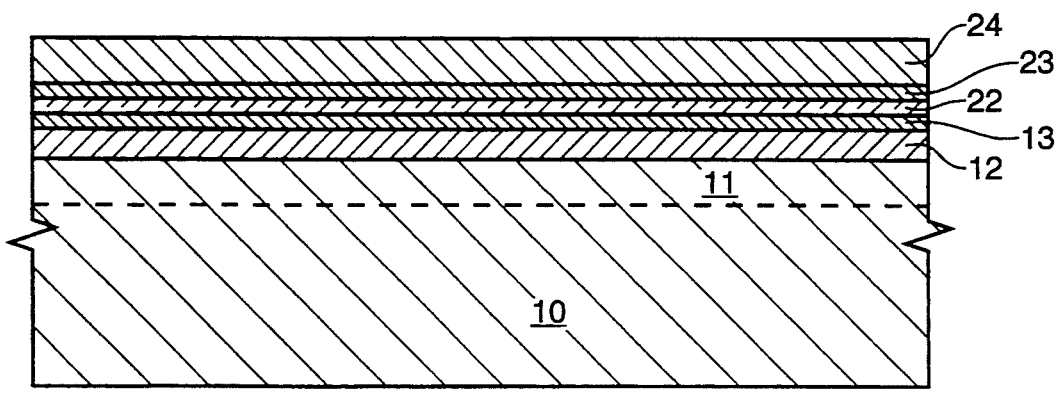
FIG. 3 is a composite cross-sectional view of an process wafer portion depicting an implementation of the present invention.

Referring now to FIG. 3, a supporting substrate 10 has been prepared by prior fabrication steps of a conventional or non-conventional process. For example, substrate 10 is comprised of a silicon (or germanium) substrate. A conductive diffusion layer 11 has been formed in substrate 10. A bottom storage capacitor electrode 12 is formed that connects to diffusion layer 11. Electrode 12 need not connect directly to diffusion layer 11 as there may also be a connecting conductor, such as a conductive plug (though not shown), formed in between layer 11 and electrode 12. Though not required, it is preferred that electrode 12 is conductively doped polysilicon. Assuming electrode 12 is polysilicon, it is now subjected to a rapid thermal processing step (in this case rapid thermal nitride (RTN)) which converts a top portion of polysilicon 12 into silicon nitride layer 13 (or RTN layer 13). Next, a capacitor cell dielectric 22, preferably tantalum oxide ($Ta_2O_5$), is formed over RTN layer 13. Next, semiconductive layer 23, in this case undoped polysilicon, is formed over cell dielectric layer 22. Next, semiconductive layer 23 is converted into a reaction prevention barrier 23 by subjecting semiconductive layer 23 to rapid thermal processing (RTP) step, such as rapid thermal processed silicon nitride (or RTN). Next, conductive material 24 (titanium nitride (TiN)) is formed over reaction prevention barrier 23 to form a top storage capacitor electrode. The process then continues by conventional methods to complete the DRAM device.

It is to be understood that although the present invention has been described in a preferred embodiment, various modifications known to those skilled in the art may be made without departing from the invention as recited in the several claims appended hereto.

What is claimed is:

1. A method for forming an reaction prevention barrier between a first conductive layer and a tantalum oxide layer on a supporting substrate of a semiconductor device, said method comprising the steps of:
   forming said tantalum oxide layer;
   forming a semiconductive layer over said tantalum oxide layer;
   converting said semiconductive layer into said reaction prevention barrier by subjecting said semiconductive layer to a rapid thermal processing (RTP) step; and
   forming said conductive material over said reaction prevention barrier.

2. The method as recited in claim 1, wherein said supporting substrate comprises a second conductive layer.

3. The method as recited in claim 2, wherein said supporting substrate further comprises an insulator overlying said conductive layer.

4. The method as recited in claim 3, wherein said reaction prevent barrier is a rapid thermally processed silicon nitride.

5. The method as recited in claim 1, wherein said first conductive layer and said tantalum oxide layer are chemically reactive with one another.

6. The method as recited in claim 1, wherein said conductive material comprises a conductive material selected from the group consisting of a refractory metal nitride, conductively doped polysilicon and metals.

7. The method as recited in claim 6, wherein said refractory metal nitride is titanium nitride (TiN).

8. A method for forming a capacitor on a supporting substrate of a semiconductor device, said method comprising the steps of:
   forming a bottom capacitor conductive electrode;
   forming an insulator over said bottom electrode via a first rapid thermal processing step (RTP);
   forming tantalum oxide layer as capacitor dielectric over said first RTP layer;
   forming a semiconductive layer over said tantalum oxide layer;
   converting said semiconductive layer into a reaction prevention barrier by subjecting said semiconductive layer to a second rapid thermal processing step; and
   forming a top capacitor conductive electrode over said reaction prevent barrier.

9. The method as recited in claim 8, wherein said supporting substrate comprises a silicon substrate.

10. The method as recited in claim 8, wherein said bottom electrode comprises conductively doped polysilicon.

11. The method as recited in claim 8, wherein said tantalum oxide layers is a material that is chemically reactive with polysilicon.

12. The method as recited in claim 8, wherein said semiconductive layer is polysilicon.

13. The method as recited in claim 8, wherein said first and second RTP steps form rapid thermal silicon nitride (RTN).

14. The method as recited in claim 8, wherein said top electrode comprises a conductive material selected from the group consisting a refractory metal nitride, conductively doped polysilicon and metals.

15. The method as recited in claim 14, wherein said refractory metal nitride is titanium nitride (TiN).

16. A method for forming a storage capacitor on a supporting silicon substrate of a semiconductor device, said method comprising the steps of:
   forming a bottom capacitor electrode comprising conductively doped polysilicon;
   forming an insulating layer over said bottom electrode via a first rapid thermal processing step (RTP) using rapid thermal silicon nitride (RTN);
   forming a capacitor dielectric material comprising tantalum oxide ($Ta_2O_5$) over said insulating layer;
   forming a semiconductive layer comprising polysilicon over said capacitor dielectric material;
   converting said semiconductive layer into a reaction prevention barrier by subjecting said semiconductive layer to a second rapid thermal processing step (RTP) using rapid thermal silicon nitride (RTN); and
   forming a top capacitor conductive electrode comprising titanium nitride (TiN) over said reaction prevention barrier.

* * * * *